United States Patent
Lin et al.

(10) Patent No.: US 10,424,391 B2
(45) Date of Patent: Sep. 24, 2019

(54) DECODING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); Yu-Cheng Hsu, Yilan County (TW); Szu-Wei Chen, New Taipei (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/811,695

(22) Filed: Nov. 14, 2017

(65) Prior Publication Data
US 2019/0088336 A1 Mar. 21, 2019

(30) Foreign Application Priority Data
Sep. 19, 2017 (TW) .............................. 106132003 A

(51) Int. Cl.
*G11C 29/00* (2006.01)
*G11C 29/52* (2006.01)
*G11C 16/10* (2006.01)
*G06F 12/02* (2006.01)
*G06F 11/10* (2006.01)
(Continued)

(52) U.S. Cl.
CPC .......... *G11C 29/52* (2013.01); *G06F 11/1068* (2013.01); *G06F 11/1072* (2013.01); *G06F 12/0246* (2013.01); *G11C 11/5628* (2013.01); *G11C 16/0483* (2013.01); *G11C 16/08* (2013.01); *G11C 16/10* (2013.01); *G11C 16/26* (2013.01); *G11C 16/30* (2013.01); *G06F 2212/7201* (2013.01)

(58) Field of Classification Search
CPC ......... G11C 16/10; G11C 16/08; G11C 16/26; G11C 16/30; G11C 29/52; G06F 11/1068; G06F 12/0246; G06F 2212/7201; G06F 2207/5354
USPC ................................ 714/752, 759, 763, 764
See application file for complete search history.

(56) References Cited

U.S. PATENT DOCUMENTS 9,361,024 B1 * 6/2016 Lin ..................... G06F 12/0246
2009/0287975 A1 * 11/2009 Kim ..................... G06F 11/1072
714/746

(Continued)

*Primary Examiner* — Albert Decady
*Assistant Examiner* — Osman M Alshack
(74) *Attorney, Agent, or Firm* — JCIPRNET

(57) ABSTRACT

A decoding method, a memory controlling circuit unit, and a memory storage device are provided. The method includes: when first data is read from a first upper physical programming unit of a first physical programming unit group by using a second voltage selected from a first read voltage group, and a first error bit count of the first data is not greater than a first error bit count threshold, recording the second voltage; when a second data is read from a first lower physical programming unit of a second physical programming unit group by using a fourth voltage selected from a second read voltage group, and a second error bit count of the second data is not greater than a second error bit count threshold, recording the fourth voltage; generating a lookup table according to the second voltage and the fourth voltage; and performing a decoding operation according to the lookup table.

15 Claims, 14 Drawing Sheets

(51) Int. Cl.
  *G11C 16/30* (2006.01)
  *G11C 16/08* (2006.01)
  *G11C 16/26* (2006.01)
  *G11C 11/56* (2006.01)
  *G11C 16/04* (2006.01)

(56) References Cited

U.S. PATENT DOCUMENTS

| | | | | |
|---|---|---|---|---|
| 2010/0002506 A1* | 1/2010 | Cho | ............... | G11C 11/5628 365/185.03 |
| 2012/0311402 A1* | 12/2012 | Tseng | ............... | G06F 11/1048 714/763 |
| 2014/0229131 A1* | 8/2014 | Cohen | ............... | G11C 16/0483 702/64 |
| 2014/0293696 A1* | 10/2014 | Lin | ............... | G11C 16/26 365/185.12 |
| 2015/0006983 A1* | 1/2015 | Lin | ............... | G11C 29/50004 714/721 |
| 2015/0262694 A1* | 9/2015 | Seo | ............... | G06F 11/1068 714/764 |
| 2015/0293809 A1* | 10/2015 | Liang | ............... | G06F 11/073 714/704 |
| 2016/0011934 A1* | 1/2016 | Hsu | ............... | G06F 11/1012 714/764 |
| 2016/0054921 A1* | 2/2016 | Yeh | ............... | G06F 3/0604 711/154 |
| 2016/0163382 A1* | 6/2016 | Conley | ............... | G11C 11/5642 365/185.03 |
| 2016/0232053 A1* | 8/2016 | Lin | ............... | G06F 11/108 |

* cited by examiner

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

| Lower physical programming unit | Center physical programming unit | Upper physical programming unit | |
|---|---|---|---|
| L_0 | M_0 | U_0 | ~1301 |
| L_1 | M_1 | U_1 | ~1303 |
| L_2 | M_2 | U_2 | ~1305 |
| L_3 | M_3 | U_3 | ~1307 |
| L_4 | M_4 | U_4 | ~1309 |
| L_5 | M_5 | U_5 | ~1311 |
| ⋮ | ⋮ | ⋮ | |
| L_N | M_N | U_N | |

FIG. 13

| Lower physical programming unit | Center physical programming unit | Upper physical programming unit |
|---|---|---|
| VA_1 | VB_1, VC_1 | VD_1, VE_1, VF_1, VG_1 |

| Lower physical programming unit | Center physical programming unit | Upper physical programming unit |
|---|---|---|
| VA_2 | VB_2, VC_2 | VD_2, VE_2, VF_2, VG_2 |

| Lower physical programming unit | Center physical programming unit | Upper physical programming unit |
|---|---|---|
| VA_3 | VB_3, VC_3 | VD_3, VE_3, VF_3, VG_3 |

| Lower physical programming unit | Center physical programming unit | Upper physical programming unit |
|---|---|---|
| VA_1 | VB_2, VC_2 | VD_3, VE_3, VF_3, VG_3 |

DECODING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 106132003, filed on Sep. 19, 2017. The entirety of the above-mentioned patent application is hereby incorporated by reference herein and made a part of this specification.

BACKGROUND

1. Technology Field

The invention relates to a decoding method, a memory controlling circuit unit and a memory storage device and more particularly, to a decoding method, a memory controlling circuit unit and a memory storage device for generating and using a lookup table.

2. Description of Related Art

Along with rapid development of digital cameras, cell phones, and MP3 players in recently years, consumers' demands for storage media has increased drastically. A rewritable non-volatile memory module (for example, a flash memory), due to having features such as data non-volatility, low power consumption, small volume, and non-mechanical structure, is adaptable to be applied in various portable multi-media devices mentioned above.

Generally, during a process of correcting errors of data by performing a decoding operation using encoded data generated by using multi-frame encoding, a read voltage group is usually selected from a plurality of predetermined read voltage groups, and the decoding operation is performed by reading a corresponding physical programming unit according to the selected read voltage group. However, an optimal voltage suitable for reading a lower physical programming unit, an optimal voltage suitable for reading a center physical programming unit and an optimal voltage suitable for reading a center physical programming unit are commonly not within the same read voltage group. As a result, when the data required for the decoding operation is read using one of the read voltage groups, a scenario that an error bit count (or an error rate) of the data read from a physical programming unit is relatively low, but error bit counts (or the error rates) of the data read from other physical programming units are relatively high occurs, such that a success rate of the decoding operation performed according to the encoded data generated by using the multi-frame encoding is reduced.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a decoding method, a memory controlling circuit unit and a memory storage device capable of recording a plurality of optimal read voltages for reading data from physical programming units which are selected from a plurality of read voltage groups in a lookup table and reading data required during a decoding process using the voltages recorded in the lookup table to achieve a lowest error bit count (or error rate) of the read data, thereby enhancing a success rate of correcting the data during the decoding process.

According to an exemplary embodiment of the invention, a decoding method for a rewritable non-volatile memory module is provided. The rewritable non-volatile memory module has a plurality of physical erasing units, each of the physical erasing units has a plurality of physical programming unit groups, and each of the physical programming unit groups has an upper physical programming unit and a lower physical programming unit. The decoding method includes: reading a first physical programming unit group among the physical programming unit groups by using a plurality of first voltages of a first read voltage group; when first data is read from a first upper physical programming unit of the first physical programming unit group by using at least one second voltage selected from the first voltages, and a first error bit count of the first data is not greater than a first error bit count threshold, recording the second voltage; reading a second physical programming unit group among the physical programming unit groups by using a plurality of third voltages of a second read voltage group; when second data is read from a first lower physical programming unit of the second physical programming unit group by using at least one fourth voltage selected from the third voltages, and a second error bit count of the second data is not greater than a second error bit count threshold, recording the fourth voltage; generating a lookup table according to the second voltage and the fourth voltage; and performing a decoding operation according to the lookup table.

According to an exemplary embodiment of the invention, a memory controlling circuit unit for a rewritable non-volatile memory module is provided. The rewritable non-volatile memory module has a plurality of physical erasing units, each of the physical erasing units has a plurality of physical programming unit groups, and each of the physical programming unit groups has an upper physical programming unit and a lower physical programming unit. The memory controlling circuit unit includes a host interface, a memory interface and a memory management circuit. The host interface is configured to be coupled to a host system. The memory interface is configured to be coupled to the rewritable non-volatile memory module. The memory management circuit is coupled to the host interface and the memory interface. The memory management circuit is configured to perform the following operations which include: reading a first physical programming unit group among the physical programming unit groups by using a plurality of first voltages of a first read voltage group; when first data is read from a first upper physical programming unit of the first physical programming unit group by using at least one second voltage selected from the first voltages, and a first error bit count of the first data is not greater than a first error bit count threshold, recording the second voltage; reading a second physical programming unit group among the physical programming unit groups by using a plurality of third voltages of a second read voltage group; when second data is read from a first lower physical programming unit of the second physical programming unit group by using at least one fourth voltage selected from the third voltages, and a second error bit count of the second data is not greater than a second error bit count threshold, recording the fourth voltage; generating a lookup table according to the second voltage and the fourth voltage; and performing a decoding operation according to the lookup table.

According to an exemplary embodiment of the invention, a memory storage device is provided. The memory storage device includes a connection interface unit, a rewritable non-volatile memory module and a memory controlling circuit unit. The connection interface unit is configured to be coupled to a host system. The rewritable non-volatile memory module has a plurality of physical erasing units, each of the physical erasing units has a plurality of physical programming unit groups, and each of the physical programming unit groups has an upper physical programming unit and a lower physical programming unit. The memory controlling circuit unit is coupled to the connection interface unit and the rewritable non-volatile memory module and configured to perform the following operations which include: reading a first physical programming unit group among the physical programming unit groups by using a plurality of first voltages of a first read voltage group; when first data is read from a first upper physical programming unit of the first physical programming unit group by using at least one second voltage selected from the first voltages, and a first error bit count of the first data is not greater than a first error bit count threshold, recording the second voltage; reading a second physical programming unit group among the physical programming unit groups by using a plurality of third voltages of a second read voltage group; when second data is read from a first lower physical programming unit of the second physical programming unit group by using at least one fourth voltage selected from the third voltages, and a second error bit count of the second data is not greater than a second error bit count threshold, recording the fourth voltage; generating a lookup table according to the second voltage and the fourth voltage; and performing a decoding operation according to the lookup table.

To sum up, the decoding method, the memory controlling circuit unit and the memory storage device of the invention can record a plurality of optimal read voltages for reading the data from the physical programming units which are selected from a plurality of read voltage groups in a lookup table and during the process of decoding using the encoded data generated by multi-frame encoding, read the corresponding data using the voltages recorded in the lookup table, so as to achieve a lowest error bit count (or error rate) of the read data. Thereby, in the decoding operation subsequently performed according to the read data and the encoded data, the success rate of correcting the errors of the data can be enhanced.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 10 is a schematic exemplary diagram illustrating a physical erasing unit according to an exemplary embodiment of the invention.

FIG. 13 is an exemplary diagram illustrating a plurality of physical programming unit groups of a physical erasing unit according to an exemplary embodiment of the invention.

FIG. 14A to FIG. 14C are schematic diagrams illustrating read voltage groups for the retry-read mechanism according to an exemplary embodiment of the invention.

FIG. 15 is a schematic diagram illustrating a lookup table for recording optimal read voltages according to an exemplary embodiment of the invention.

DESCRIPTION OF THE EMBODIMENTS

Figure 1:
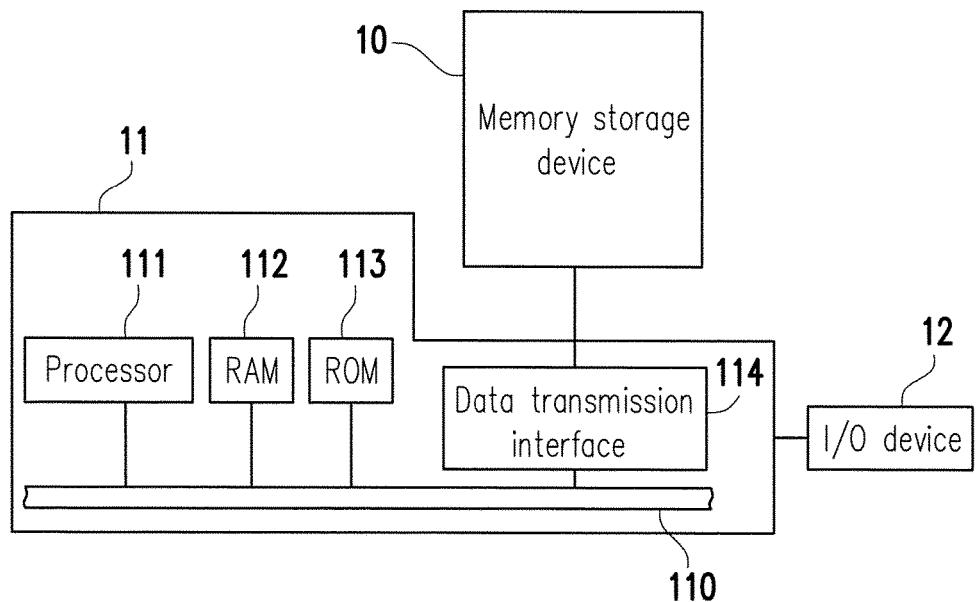
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

Generally, a memory storage device (which is also referred to as a memory storage system) includes a rewritable non-volatile memory module and a controller (which is also referred to as a controlling circuit). The memory storage device is usually used together with a host system, such that the host system may write data into the memory storage device or read data from the memory storage device.

Generally, a memory storage device (also known as a memory storage system) includes a rewritable non-volatile memory module and a controller (also known as a control circuit). The memory storage device is usually used together with a host system so that the host system may write data into the memory storage device or read data from the memory storage device.

Figure 2:
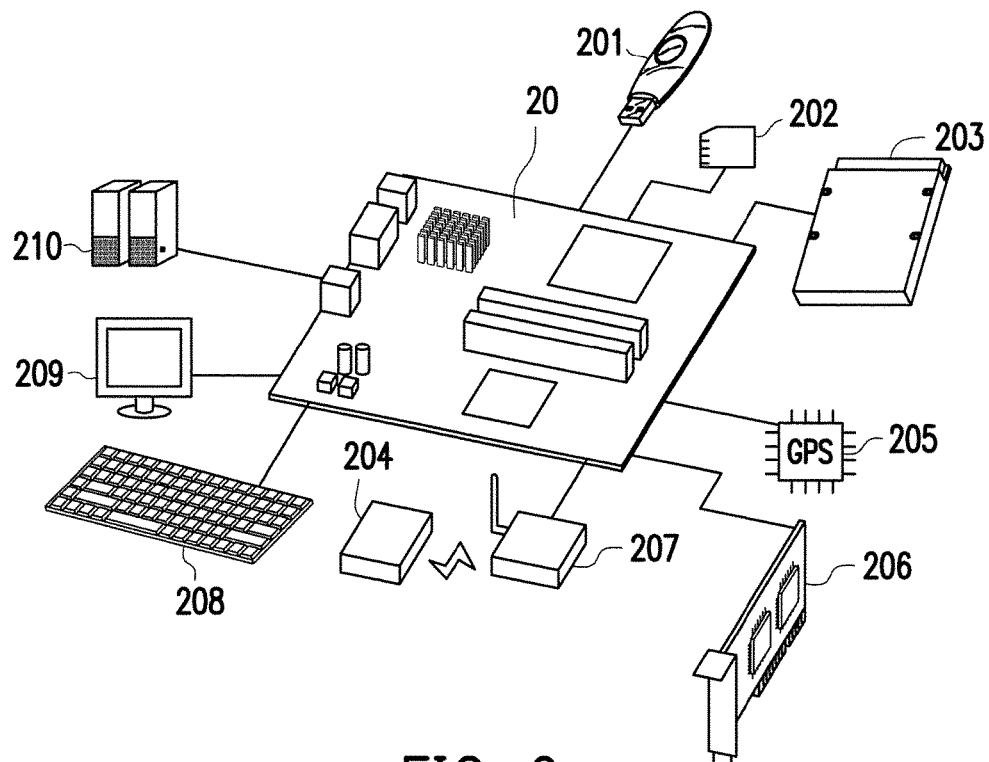
FIG. 2 is a schematic diagram illustrating a host system, a memory storage device and an I/O device according to another exemplary embodiment of the invention.

FIG. 1 is a schematic diagram illustrating a host system, a memory storage device and an input/output (I/O) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a random access memory (RAM) 112, a read only memory (ROM) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 may store data into the memory storage device 10 or read data from the memory storage device 10 through the data transmission interface 114. Further, the host system 11 is coupled to an I/O device 12 through the system bus 110. For example, the host system 11 may transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. An amount of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a solid state drive (SSD) 203 or a wireless memory storage device 204. The wireless memory storage device 204 may be, for example, a memory storage device based on various wireless communication technologies, such as an near field communication (NFC) memory storage device, a wireless fidelity (WiFi) memory storage device, a Bluetooth memory storage device or a Bluetooth low energy (BLE) memory storage device (e.g., iBeacon). Further, the main board 20 may also be coupled to various I/O devices including a global positioning system (GPS) module 205, a network interface card 206, a wireless transmission device 207, a keyboard 208, a monitor 209 and a speaker 210 through the system bus 110. For example, in an exemplary embodiment, the main board 20 may access to the wireless memory storage device 204 through the wireless transmission device 207.

Figure 3:
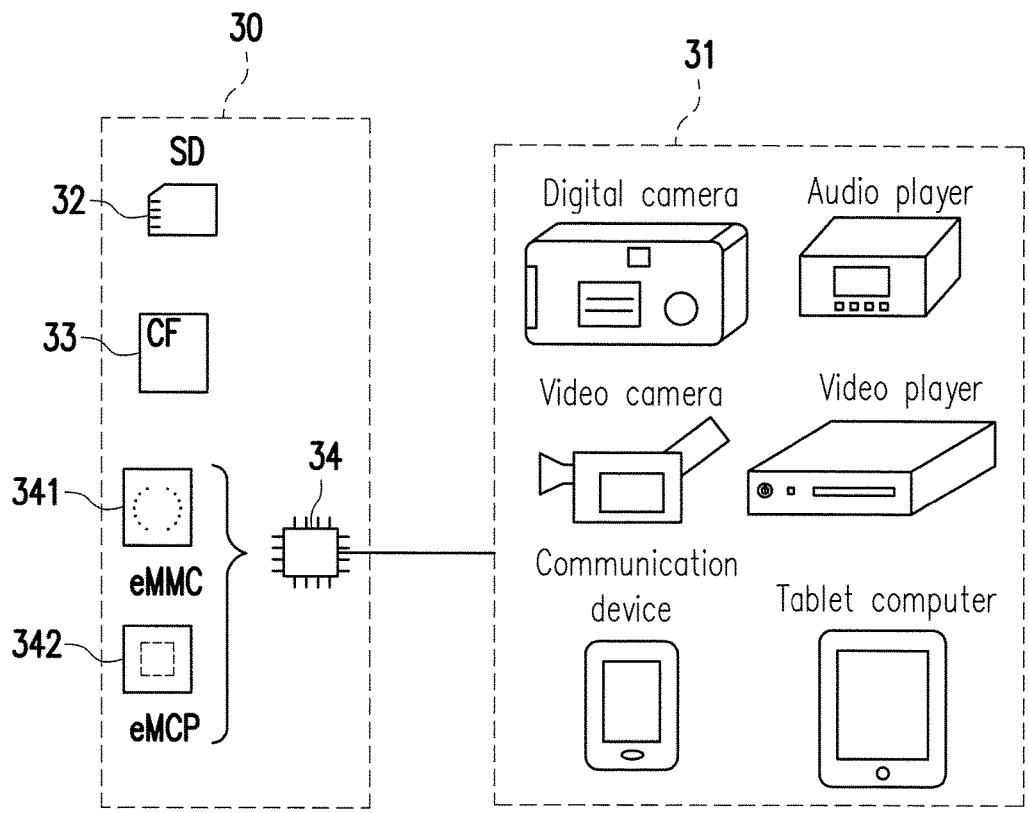
FIG. 3 is a schematic diagram illustrating a host system and a memory storage device according to another exemplary embodiment of the invention.

In an exemplary embodiment, the aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, and a memory storage device 30 may be various non-volatile memory devices used by the host system 31, such as a secure digital (SD) card 32, a compact flash (CF) card 33 or an embedded storage device 34. The embedded storage device 34 includes various embedded storage devices capable of directly coupling to a memory module onto a substrate of the host system, such as an embedded MMC (eMMC) 341 and/or an embedded multi chip package (eMCP) 342.

Figure 4:
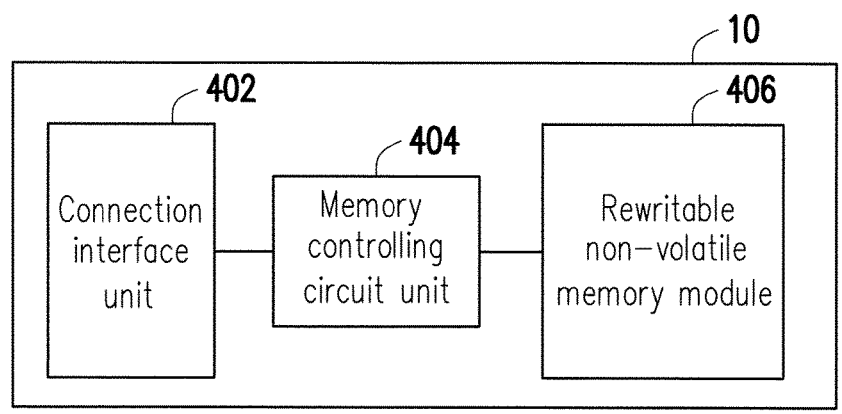
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a serial advanced technology attachment (SATA) standard. Nevertheless, it should be understood that the invention is not limited thereto, and the connection interface unit 402 may also be compatible to a parallel advanced technology attachment (PATA) standard, an institute of electrical and electronic engineers (IEEE) 1394 standard, a peripheral component interconnect express (PCI Express) interface standard, a universal serial bus (USB) standard, a secure digital (SD) interface standard, a ultra high speed-I (UHS-I) interface standard, a ultra high speed-II (UHS-II) interface standard, a memory stick (MS) interface standard, a multi-chip package interface standard, a multi media card (MMC) interface standard, an embedded multimedia card (eMMC) interface standard, a universal flash storage (UFS) interface standard, an embedded multi chip package (eMCP) interface standard, a compact flash (CF) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations of writing, reading and erasing data in the rewritable non-volatile memory storage module 406 according to the commands from the host system 11.

The rewritable non-volatile memory module 406 is coupled to the memory controlling circuit unit 404 and configured to store data written by the host system 11. The rewritable non-volatile memory module 406 may be a single level cell (SLC) NAND flash memory module (i.e., a flash memory module capable of storing one bit in one memory cell), a multi level cell (MLC) NAND flash memory module (i.e., a flash memory module capable of storing two bits in one memory cell), a triple level cell (TLC) NAND flash memory module (i.e., a flash memory module capable of storing three bits in one memory cell), other flash memory modules or any memory module having the same characteristics.

The memory cells in the rewritable non-volatile memory module 406 are disposed in an array. Hereinafter, a two-dimensional array is used to describe the memory cell array. However, it should be noted that the following exemplary embodiment is only an example of the memory cell array, and in other exemplary embodiments, a disposition method of the memory cell array may be adjusted to satisfy actual requirements.

Figure 5:
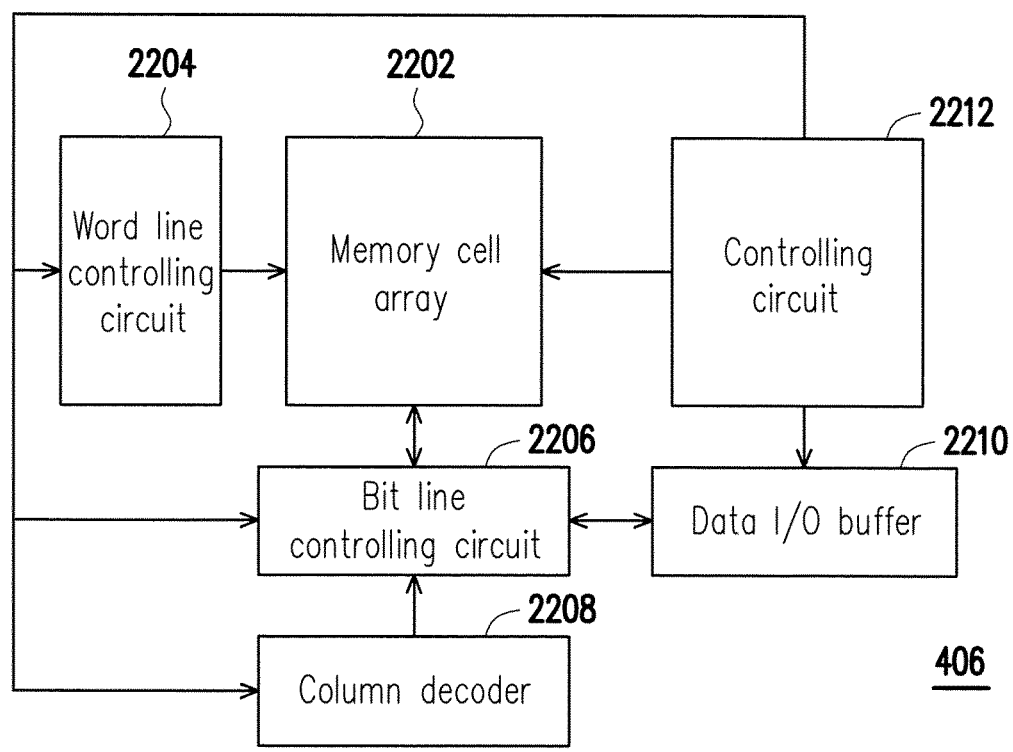
FIG. 5 is a schematic diagram illustrating a rewritable non-volatile memory module according to an exemplary embodiment of the invention.
Figure 6:
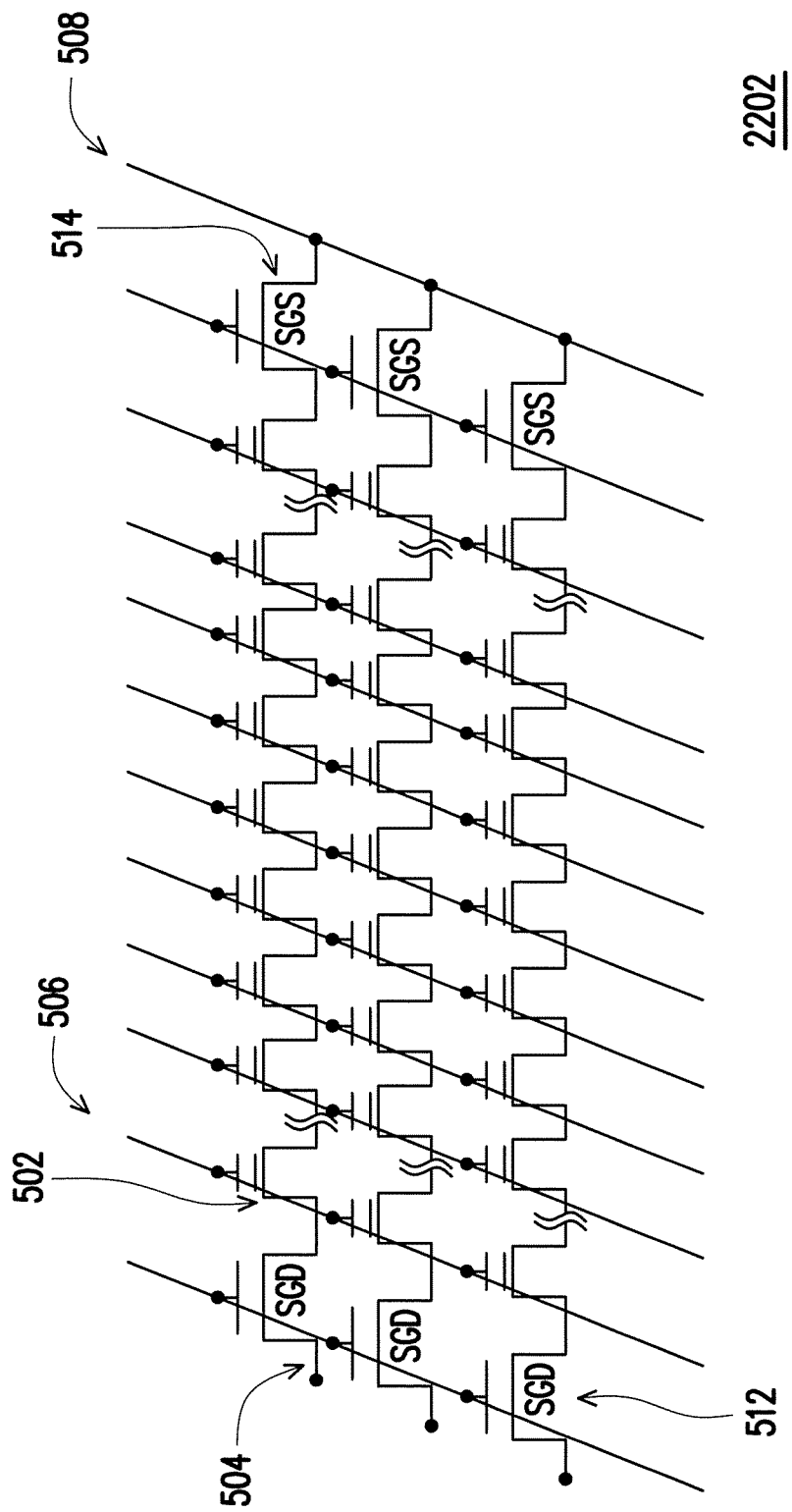
FIG. 6 is a schematic diagram illustrating a memory cell array according to an exemplary embodiment of the invention.

FIG. 5 is a schematic diagram illustrating a rewritable non-volatile memory module according to an exemplary embodiment of the invention. FIG. 6 is a schematic diagram illustrating a memory cell array according to an exemplary embodiment of the invention.

Referring to both FIG. 5 and FIG. 6, the rewritable non-volatile memory module 406 includes a memory cell array 2202, a word line controlling circuit 2204, a bit line controlling circuit 2206, a column decoder 2208, a data input/output (I/O) buffer 2210, and a controlling circuit 2212.

In the present exemplary embodiment, the memory cell array 2202 includes a plurality of memory cells 502 for storing data, a plurality of select gate drain (SGD) transistors 512 and a plurality of select gate source (SGS) transistors 514 and a plurality of bit lines 504, a plurality of word lines 506 and a common source line 508 which are connected with the memory cells (as illustrated in FIG. 6). The memory cells 502 are disposed at intersections formed by the bit lines 504 and the word lines 506 in an array form (or in a three-dimensional stacking form). When receiving a write command or a read command from the memory controlling circuit unit 404, the controlling circuit 2212 controls the word line controlling circuit 2204, the bit line controlling circuit 2206, the column decoder 2208, the I/O buffer 2210 to write data into the memory cell array 2202 or read data from the memory cell array 2202. Therein, the word line controlling circuit 2204 is configured to control voltages applied to the word lines 506, the bit line controlling circuit 2206 is configured to control voltages applied to the bit lines 504, the column decoder 2208 is configured to select a corresponding bit line according to a row address in a command, and the I/O buffer 2210 is configured to temporarily store data.

Each of the memory cells in the rewritable non-volatile memory module 406 stores one or more bits by the changing of a threshold voltage. Specifically, there is a charge trapping layer between a control gate and a channel of each memory cell. Through applying a writing voltage to the control gate, an amount of electrons in the charge trapping layer may be changed, such that the threshold voltage of each memory cell is changed. This process of changing the threshold voltage is also referred to as "writing data into the memory cell" or "programming the memory cell". As the threshold voltage is changed, each of the memory cells of the memory cell array 2202 has a plurality of storage states. Meanwhile, the storage states of the memory cells may be determined through reading voltages, so as to obtain the one or more bits stored by each of the memory cells.

Figure 7:
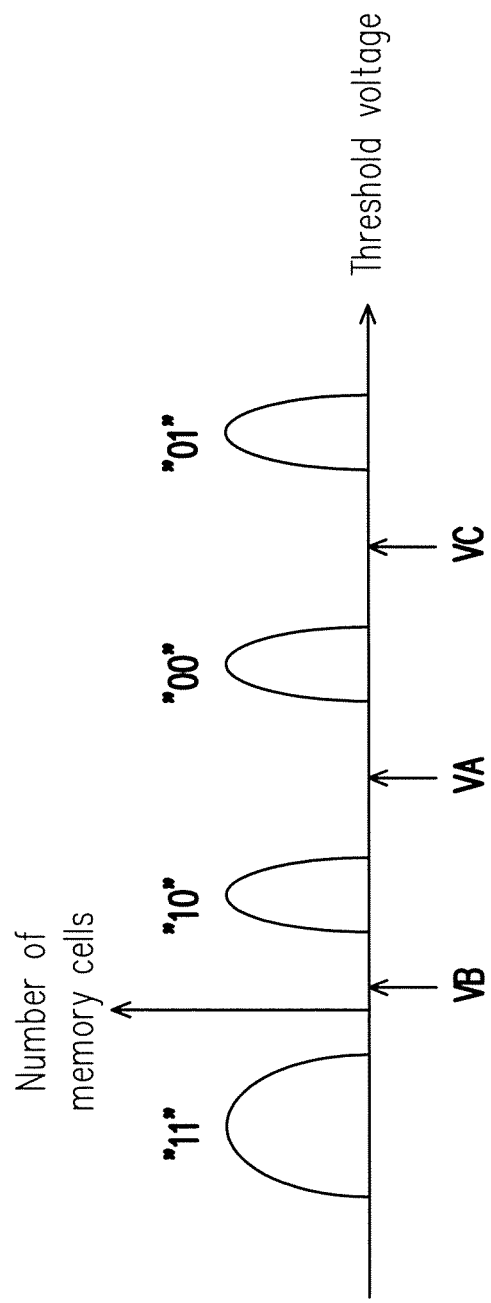
FIG. 7 is a statistical distribution diagram of gate voltages corresponding to write data stored in the memory cell array according to an exemplary embodiment of the invention.

FIG. 7 is a statistical distribution diagram of gate voltages corresponding to write data stored in the memory cell array according to an exemplary embodiment of the invention.

Referring to FIG. 7, taking an MLC NAND flash memory for example, each of the memory cells has four storage states depending on different threshold voltages, and the states represent bits "11", "10", "00" and "01", respectively. In other words, each of the states includes a least significant bit (LSB) and a most significant bit (MSB). In the present exemplary embodiment, a first bit counted from the left in the states (i.e., "11", "10", "00" and "01") is the LSB, and a second bit counted from the left is the MSB. Accordingly, in the exemplary embodiment, each of the memory cells may store two bits. It should be understood that the corresponding relationship between the threshold voltages and the storage states as illustrated in FIG. 7 is merely an example. In another exemplary embodiment of the invention, the storage states corresponding to the threshold voltages may also be arranged as "11", "10", "01" and "00" or in other arrangements. In addition, in another exemplary embodiment, it may also be defined that the first bit counted from the left is the MSB, and the second bit counted from the left is the LSB.

In an exemplary embodiment that a memory cell is capable of storing a plurality of bits (for example, an MLC or a TLC NAND flash memory module), physical programming units belonging to the same word line may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. In an exemplary embodiment, the lower physical programming unit is also known as a fast page, and the upper physical programming unit is also known as a slow page. In addition, in the TLC NAND flash memory, a least significant bit (LSB) of a memory cell belongs to the lower physical programming unit, a center significant bit (CSB) of that memory cell belongs to the upper physical programming unit, and a most significant bit (MSB) of that memory cell belongs to the upper physical programming unit.

Figure 8:
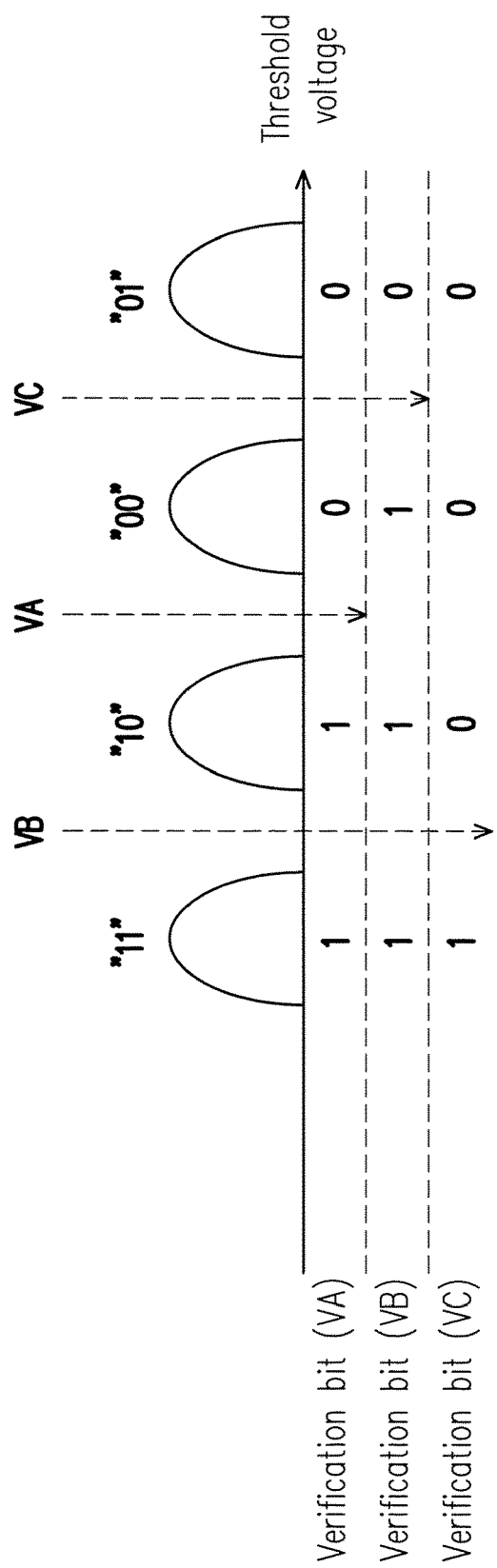
FIG. 8 is a schematic diagram of reading data from a memory cell according to an exemplary embodiment of the invention.

FIG. 8 is a schematic diagram of reading data from a memory cell according to an exemplary embodiment of the invention, which takes an MLC NAND flash memory for example.

Referring to FIG. 8, in a reading operation of the memory cells of the memory cell array 2202, the read voltages VA to VC are applied to the control gate, and data stored in a memory cell is identified according to a turned-on state of the channel of the memory cell. A verification bit (VA) is configured to indicate whether the channel of the memory cell is turned on when a read voltage VA is applied, a verification bit (VC) is configured to indicate whether the channel of the memory cell is turned on when a read voltage VC is applied, and a verification bit (VB) is configured to indicate whether the channel of the memory cell is turned on when a read voltage VB is applied. It is assumed that the corresponding channel of the memory cell being turned on is indicated by the verification bit of "1", and the corresponding channel of the memory cell not being turned on is indicated by the verification bit of "0", which of the storage states the memory cell is in may be determined according to the verification bits (VA) to (VC), and thereby, the bits being stored may be obtained.

Figure 9:
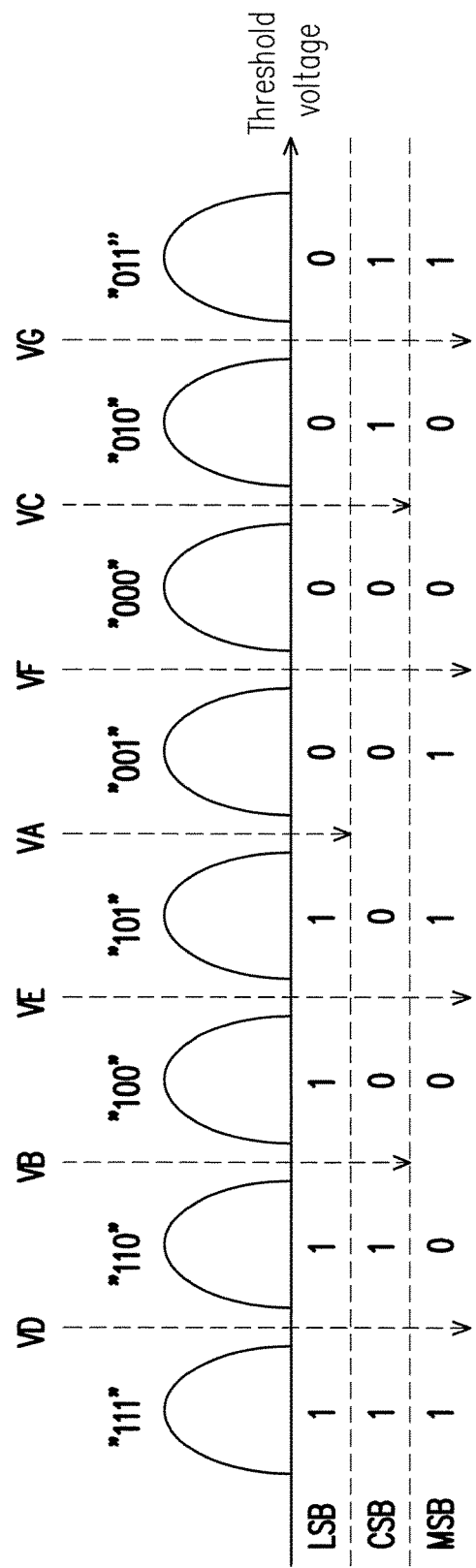
FIG. 9 is a schematic diagram of reading data from a memory cell according to another exemplary embodiment of the invention.

FIG. 9 is a schematic diagram of reading data from a memory cell according to another exemplary embodiment of the invention.

Referring to FIG. 9, taking a TLC NAND flash memory for example, each storage state includes a LSB (the first bit from the left), a center significant bit (CSB, the second bit from the left), and a MSB (the third bit from the left). In this example, each memory cell has 8 storage states (i.e., "111", "110", "100", "101", "001", "000", "010" and "011") according different threshold voltages. By applying the read voltages VA to VG to the control gate, the bits stored in the memory cell may be identified.

Therein, it should be noted that, an arrangement sequence of the eight storage states may be decided based on designs of manufacturers without being limited by the arrangement sequence set forth in the present exemplary embodiment.

In addition, the memory cells of the rewritable non-volatile memory module 406 constitute a plurality of physical programming units, and the physical programming units constitute a plurality of physical erasing units. Specifically, in FIG. 6, the memory cells on the same word line are grouped into one or more physical programming units. For example, in case the rewritable non-volatile memory module 406 is an MLC NAND flash memory module, the memory cells on the same word line and the intersections of a plurality of bit lines may constitute 2 physical programming units, i.e., an upper physical programming unit and a lower physical programming unit, while one upper physical programming unit and one lower physical programming unit may be collectively referred to as a physical programming unit group. Specially, if data to be read is located in a lower physical programming unit of a physical programming unit group, a value of each bit in the lower physical programming unit may be identified using, for example, the read voltage VA illustrated in FIG. 8. If the data to be read is in located in an upper physical programming unit of a physical programming unit group, a value of each bit in the upper physical programming unit may be identified using, for example, the read voltages VB and VC illustrated on FIG. 8.

Alternatively, in case the rewritable non-volatile memory module 406 is a TLC NAND flash memory module, the memory cells on the same word line and the intersections of a plurality of bit lines may constitute 3 physical programming units, i.e., an upper physical programming unit, a center physical programming unit and a lower physical programming unit, while an upper physical programming unit, one center physical programming unit and one lower physical programming unit may be collectively referred to as one physical programming unit group. Specially, if the data to be read is located in a lower physical programming unit of a physical programming unit group, a value of each bit in the lower physical programming unit may be identified using, for example, the read voltage VA illustrated in FIG. 9. If the data to be read is located in a center physical programming unit of a physical programming unit group, a value of each bit of the center physical programming unit may be identified using, for example, the read voltages VB and VC illustrated in FIG. 9. If the data to be read in located in an upper physical programming unit of a physical programming unit group, a value of each bit in the upper physical programming unit may be identified using, for example, read voltages VD, VE, VF and VG illustrated in FIG. 9.

In the present exemplary embodiment, a physical programming unit is the smallest unit for programming. That is, a physical programming unit is the smallest unit for writing data. For example, a physical programming unit is a physical page or a physical sector. In case the physical programming unit is the physical page, each physical programming unit commonly includes a data bit area and a redundancy bit area. The data bit area has multiple physical sectors configured to store user data, and the redundant bit area is configured to store system data (e.g., an error correcting code). In the present exemplary embodiment, each data bit area contains 32 physical sectors, and a size of each physical sector is 512 bytes (B). However, in other exemplary embodiments, the data bit area may also include 8, 16, or more or less of the physical sectors, and a size of each physical sector may be greater or smaller. On the other hand, a physical erasing unit is the smallest unit for erasing. That is, each physical erasing unit contains the least number of memory cells to be erased altogether. For instance, a physical erasing unit is a physical block.

FIG. 10 is a schematic exemplary diagram illustrating a physical erasing unit according to an exemplary embodiment of the invention.

Referring to FIG. 10, in the present exemplary embodiment, it is assumed that a physical erasing unit is composed of a plurality of physical programming unit groups, where each physical programming unit group includes a lower physical programming unit, a center physical programming unit and an upper physical programming unit formed by a plurality of memory cells arranged on the same word line. For example, in a physical erasing unit, a $0^{th}$ physical programming unit belonging to the lower physical programming unit, a $1^{st}$ physical programming unit belonging to the center physical programming unit and a $2^{nd}$ physical programming unit belonging to the upper physical programming unit may be considered as one physical programming unit group. Similarly, a $3^{rd}$, a $4^{th}$ and a $5^{th}$ physical programming units may be considered as one physical programming unit group, and likewise, other physical programming units are also grouped into plurality of physical programming unit groups in this manner.

Figure 11:
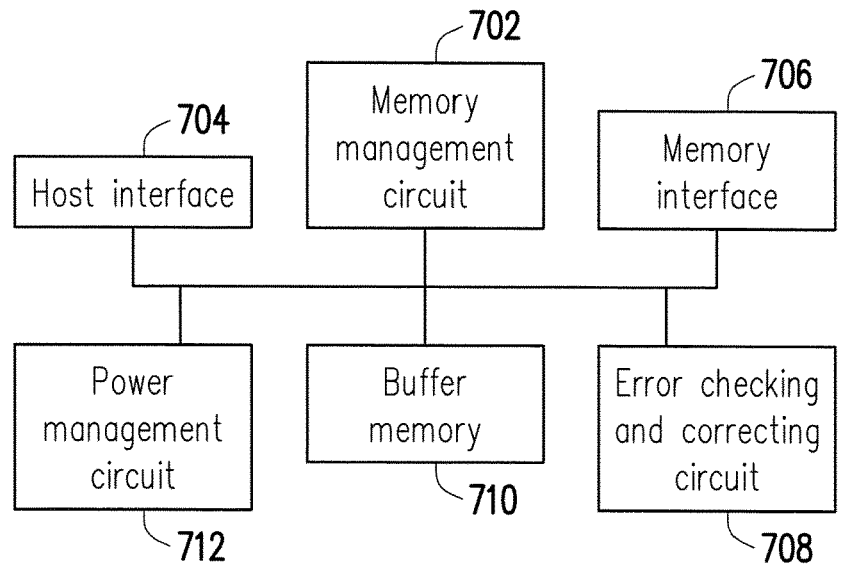
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention.

Referring to FIG. 11, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands, and when the memory storage device 10 is in operation, the control commands are executed to perform various operations such as data writing, data reading and data erasing. Operations of the memory management circuit 702 or operations of any circuit element included in the memory controlling circuit unit 404 are equivalent to the operations of the memory controlling circuit unit 404.

In the present exemplary embodiment, the control commands of the memory management circuit 702 are implemented in a firmware form. For instance, the memory management circuit 702 has a microprocessor unit (not shown) and a read-only memory (not shown), and the control commands are burnt into the read-only memory. When the memory storage device 10 is in operation, the control commands are executed by the microprocessor unit to perform various data operations, such as data writing, data reading or data erasing.

In another exemplary embodiment, the control commands of the memory management circuit 702 may also be stored in a specific area (e.g., a system area in the memory module exclusively used for storing the system data) of the rewritable non-volatile memory module 406. In addition, the memory management circuit 702 has a microprocessor unit (not shown), a read-only memory (not shown), and a random access memory (not shown). Specially, the read-only memory has a boot code, and when the memory controlling circuit unit 404 is enabled, the microprocessor unit first executes the boot code to load the control commands stored in the rewritable non-volatile memory module 406 into the random access memory of the memory management circuit 70. Afterwards, the microprocessor unit executes the control commands for various data operations such as data writing, data reading and data erasing.

Additionally, in another exemplary embodiment, the control commands of the memory management circuit 702 may also be implemented in a hardware form. For instance, the memory management circuit 702 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory management circuit is configured to manage the memory cells of the rewritable non-volatile memory module 406 or groups thereof. The memory writing circuit is configured to issue a write command sequence to the rewritable non-volatile memory module 406 to write data into the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process data to be written into the rewritable non-volatile memory module 406 and data read from rewritable non-volatile memory module 406. The write command sequence, the read command sequence and the erase command sequence may respectively include one or more program codes or instruction codes and may be configured to instruct the rewritable non-volatile memory module 406 to execute corresponding operations such as data writing, data reading and data erasing. In an exemplary embodiment, the memory management circuit 702 may also issue other command sequences to the rewritable non-volatile memory module 406 for instructing to perform corresponding operations.

The host interface 704 is coupled to the memory management circuit 702 and configured to receive and identify commands and data transmitted from the host system 11. Namely, the commands and data transmitted by the host system 11 are transmitted to the memory management circuit 702 through the host interface 704. In the present exemplary embodiment, the host interface 704 is compatible with the SATA standard. Nevertheless, it should be understood that the invention is not limited thereto, and the host interface 704 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 706 is coupled to the memory management circuit 702 and configured to access to the rewritable non-volatile memory module 406. In other words, the data to be written into the rewritable non-volatile memory module 406 is converted to a format acceptable for the rewritable non-volatile memory module 406 by the memory interface 706. Specifically, in case the memory management circuit 702 is to access the rewritable non-volatile memory module 406, the memory interface 706 transmits corresponding command sequences. For instance, the command sequences may include a write command sequence instructing to write data, a read command sequence instructing to read data, an erase command sequence instructing to erase data and a variety of corresponding command sequences for instructing various memory operations (e.g., an operation of changing a read voltage level, an operation of performing a garbage collection procedure, and so on). The command sequences are, for example, generated by the memory management circuit 702 and transmitted to the rewritable non-volatile memory module 406 through the memory interface 706. The command sequences may include one or a plurality of signals or data on a bus. The signals or data may include instruction codes or program codes. For example, a read command sequence may include information related to, for example, an identification code for reading, a memory address and so on.

The error checking and correcting circuit 708 is coupled to the memory management circuit 702 and configured to perform an error checking and correcting procedure for ensuring data accuracy. Specifically, when the memory management circuit 702 receives a writing command from the host system 11, the error checking and correcting circuit 708 generates an error correcting code (ECC) and/or an error detecting code (EDC) corresponding to the write command, and the memory management circuit 702 writes the data corresponding to the write command and the corresponding ECC and/or EDC into the rewritable non-volatile memory module 406. Thereafter, when reading the data from the rewritable non-volatile memory module 406, the memory management circuit 702 simultaneously reads the ECC and/or EDC corresponding to the data from the rewritable non-volatile memory module 406, and the error checking and correcting circuit 708 performs the error checking and correcting procedure on the read data according to the ECC and/or EDC.

In an exemplary embodiment, the memory controlling circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management circuit 712 is coupled to the memory management circuit 702 and configured to control the power of the memory storage device 10.

In the present exemplary embodiment, the error checking and correcting circuit 708 may perform single-frame encoding on data store in one physical programming unit and may also perform multi-frame encoding on data stored in multiple physical programming units. The single-frame encoding and the multi-frame encoding may respectively use at least one of encoding algorithms, including a low density parity code (LDPC) algorithm, a BCH code algorithm, a convolutional code algorithm or a turbo code algorithm. Alternatively, in an exemplary embodiment, the multi-frame encoding may also use a Reed-Solomon codes (RS codes) algorithm or an XOR algorithm. In addition, in another exemplary embodiment, more encoding algorithms that are not mentioned above may also be used, which will not be described any further. According to an encoding algorithm which is used, the error checking and correcting circuit 708 may encode data to be protected to generate a corresponding ECC and/or EDC. For descriptive convenience, the ECC and/or EDC generated through encoding is collectively referred to as encoded data.

It is noted that in the following description, some terms may be replaced with corresponding abbreviations for ease of reading (see Table 1).

TABLE 1

| | |
|---|---|
| rewritable non-volatile memory module | RNVM module |
| physical erasing unit | PEU |
| lower physical programming unit | LPPU |
| center physical programming unit | CPPU |
| upper physical programming unit | UPPU |
| physical programming unit | PPU |
| physical programming unit group | PPUG |
| memory management circuit | MMC |
| memory control circuit | MCC |
| error checking and correcting circuit | ECCC |
| error checking and correcting procedure | ECCP |
| read voltage group | RVG |
| error bit count | EBC |

Figure 12:
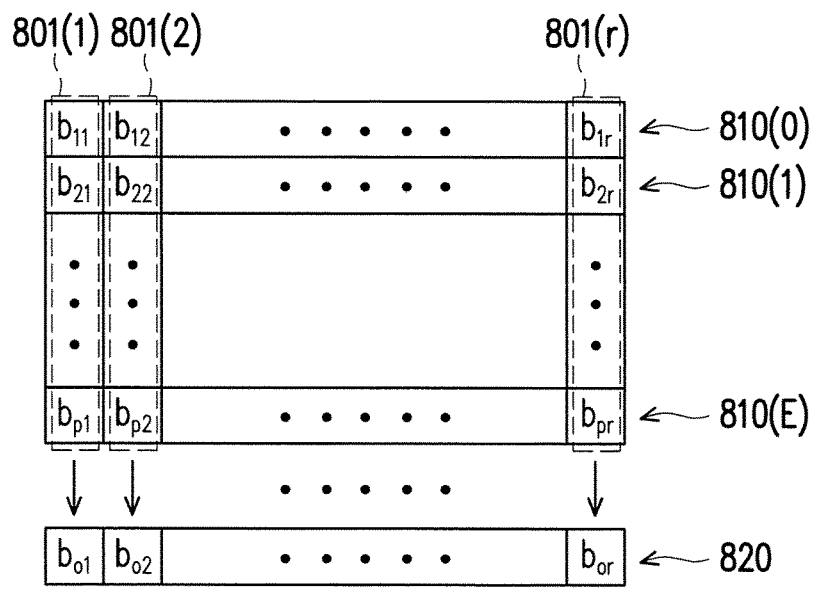
FIG. 12 is a schematic diagram illustrating the multi-frame encoding according to an exemplary embodiment of the invention.

FIG. 12 is a schematic diagram illustrating the multi-frame encoding according to an exemplary embodiment of the invention.

Referring to FIG. 12, generating corresponding encoded data 820 using data stored in PPUs 810(0) to 810(E) is taken as an example, at least a part of the data stored in each of the PPUs 810(0) to 810(E) may be considered as a frame. In the multi-frame encoding, the data in the PPUs 810(0) to 810(E) is encoded according to a position where each bit (or each byte) is located. For instance, bits $b_{11}$, $b_{21}$, . . . and $b_{p1}$ located at a position 801(1) are encoded into a bit $b_{o1}$ in the encoded data 820, bits $b_{12}$, $b_{22}$, . . . and $b_{p2}$ located at a position 801(2) are encoded into a bit $b_{o2}$ in the encoded data 820, and by deriving in the same way, bits $b_{1r}$, $b_{2r}$, . . . and $b_{pr}$ located at a position 801(r) are encoded into a bit $b_{or}$ in the encoded data 820. Thereafter, the data read from the PPUs 810(0) to 810(E) may be decoded according to the encoded data 820, so as to attempt to correct errors that may possibly exist in the read data.

Additionally, in another exemplary embodiment illustrated in FIG. 12, the data for generating the encoded data 820 may also include redundancy bits corresponding to data bits of the data stored in the PPUs 810(0) to 810(E). Taking the data stored in the PPU 810(0) for example, the redundancy bits are, for example, generated by performing the single-frame encoding on the data bits in the PPU 810(0). In the present exemplary embodiment, it is assumed that when the data stored in the PPU 810(0) is read, the data read from the PPU 810(0) may be first decoded for error checking and correcting using the redundancy bits (e.g., the encoded data for the single-frame encoding) in the PPU 810(0). However, when failure occurs to the decoding operation using the redundancy bits in the PPU 810(0) (for example, an EBC of the data stored in the PPU 810(0) after being decoded is greater than a threshold), a retry-read mechanism may be used to attempt to read correct data from the PPU 810(0). Details related to the retry-read mechanism will be set forth below. Meanwhile, when the correct data fails to be read from the PPU 810(0) by utilizing the retry-read mechanism, the encoded data 820 and the data in the PPUs 810(1) to 810(E) may be read, and the decoding operation may be performed according to the encoded data 820 and the data in the PPUs 810(1) to 810(E), thereby attempting to correct the errors existing in the data stored in the PPU 810(0). In other words, in the present exemplary embodiment, when failure occurs to the decoding operation using the encoded data generated by the single-frame encoding, and failure occurs to the reading operation by utilizing the retry-read mechanism, the decoding operation will be performed by using encoded data generated by the multi-frame encoding.

In the present exemplary embodiment, the MMC 702 configures a predetermined RVG for the RNVM module 406. For instance, in an example that the RNVM module 406 is an 8-level cell NAND memory module, the predetermined RVG includes a plurality of voltages, for example, the read voltages VA to VG illustrated in FIG. 9, and when the reading operation is performed on the RNVM module 406, the MMC 702 first reads the data stored in the RNVM module 406 using the predetermined RVG.

For instance, FIG. 13 is an exemplary diagram illustrating a plurality of physical programming unit groups of a physical erasing unit according to an exemplary embodiment of the invention.

Referring to FIG. 13, the MMC 702, when being about to read data, first uses the predetermined RVG (e.g., the read voltages VA to VG illustrated in FIG. 9) to read the data.

For instance, if the MMC 702 is about to read data from a LPPU L_0 (which is also referred to as a first LPPU) of a PPUG 1301 (which is also referred to as a second PPUG), the MMC 702 first reads the data (referred to as second data hereinafter) from the LPPU L_0 using the read voltage VA of the predetermined RVG. For instance, the MMC 702 identifies a value of each bit of this physical page using the read voltage VA of the predetermined RVG.

After the data reading operation is completed, the ECCC 708 performs an ECCP according to an ECC (i.e., redundancy bits) corresponding to the read second data. During the ECCP, the MMC 702 determines whether an EBC of the second data is greater than a predetermined EBC threshold. In the present exemplary embodiment, it is assumed that the count of the errors occurring in the second data is greater than the predetermined EBC threshold, the MMC 702 determines that the data in the LPPU L_0 fails to be correctly obtained, and the MMC 702 retries to read the data from the LPPU L_0 by utilizing the retry-read mechanism.

For instance, FIG. 14A to FIG. 14C are schematic diagrams illustrating RVGs for the retry-read mechanism according to an exemplary embodiment of the invention.

Referring to FIG. 13 and FIG. 14A to FIG. 14C simultaneously, in the present exemplary embodiment, the MMC 702 configures (or sets) in advance a RVG RR1, a RVG RR2 and a RVG RR3 for the retry-read mechanism. Each of the RVG RR1, the RVG RR2 and the RVG RR3 includes a plurality of read voltages. For instance, the RVG RR1 may include a read voltage VA_1 for reading a LPPU, read voltages VB_1 and VC_1 for reading a CPPU and read voltages VD_1, VE_1, VF_1 and VG_1 for reading an UPPU. The RVG RR2 may include a read voltage VA_2 for reading a LPPU, read voltages VB_2 and VC_2 for reading a CPPU and read voltages VD_2, VE_2, VF_2 and VG_2 for reading an UPPU. The RVG RR3 may include a read voltage VA_3 for reading a LPPU, read voltages VB_3 and VC_3 for reading a CPPU and read voltages VD_3, VE_3, VF_3 and VG_3 for reading an UPPU. It should be mentioned that although only three RVGs are illustrated in the present exemplary embodiment, the MMC 702 may also configure (or set) more or less RVGs for the retry-read mechanism in other embodiments.

In the retry-read mechanism, the MMC 702 selects a RVG sequentially from the RVGs RR1 to RR3 and retries to read the data from the LPPU L_0 according to voltages of the selected RVG. For instance, the MMC 702 firsts selects the RVG RR1 and reads the second data in the LPPU L_0 according to the read voltage VA_1 of the RVG RR1. It should be noted here that when the data of the same PPU (e.g., the second data in the LPPU L_0) is read using different read voltages, the EBC (or the error probability) of the second data may vary.

After the data reading operation is completed, the ECCC 708 calculates the EBC occurring in the second data (which is also referred to as a second EBC) according to the ECC (i.e., the redundancy bits) corresponding to the read second data and records the second EBC as an EBC threshold (which is also referred to as a second EBC threshold).

Afterwards, the MMC 702 again selects the RVG RR2 and reads the second data in the LPPU L_0 according to the read voltage VA_2 of the RVG RR2. After the data reading operation is completed, the ECCC 708 calculates the second EBC of the second data according to the ECC (i.e., the redundancy bits) corresponding to the read second data and determines whether the second EBC generated when the reading operation is performed using the read voltage VA_2 is greater than the aforementioned second EBC threshold. It is assumed in this case that the second EBC generated when the reading operation is performed using the read voltage VA_2 is greater than the aforementioned second EBC threshold, and thus, the MMC 702 does not change the second EBC threshold.

Afterwards, the MMC 702 further selects the RVG RR3 and reads the second data in the LPPU L_0 according to the read voltage VA_3. After the data reading operation is completed, the ECCC 708 calculates the second EBC of the second data according to the ECC (i.e., the redundancy bits) corresponding to the read second data and determines whether the second EBC generated when the reading operation is performed using the read voltage VA_3 is greater than the aforementioned second EBC. It is assumed in this case that the second EBC generated when the reading operation is performed using the read voltage VA_3 is greater than the aforementioned second EBC threshold, and thus, the MMC 702 does not change the second EBC threshold.

Specially, FIG. 15 is a schematic diagram illustrating a lookup table for recording optimal read voltages according to an exemplary embodiment of the invention.

Referring to FIG. 15, after reading the LPPU L_0 respectively using the RVG RR1, and the RVG RR3 and the RVG RR3, the MMC 702 may, according to second EBC threshold, determine that the second EBC generated when the reading operation is performed using the read voltage VA_1 of the RVG RR1 (which is also referred to as the second RVG) for reading the LPPU L_0 is not greater than the second EBC threshold, and thus, the MMC 702 may record the read voltage VA_1 (which is also referred to as a fourth voltage) into a lookup table T1. In other words, among the RVGs RR1 to RR3, an optimal voltage for reading the LPPU is the read voltage VA_1, and the second EBC obtained when the LPPU is read using the read voltage VA_1 is the smallest.

It should be mentioned in this case that in the operation of reading the data in the LPPU L_0 when the retry-read mechanism is performed, the MMC 702, if sill failing to correctly obtain the data in the LPPU L_0 after retrying to read using the RVG RR1, the RVG RR2 and the RVG RR3, continues to perform the decoding operation using the encoded data generated by the multi-frame encoding, thereby attempting to obtain the data in the LPPU L_0. In addition, the MMC 702, if succeeding in correctly obtaining the data in the LPPU L_0 by retrying to read the LPPU L_0 using one of the RVG RR1, the RVG RR2 and the RVG RR3, may obtain the correct data and reply to a reading request.

In addition, referring again to FIG. 13 and FIG. 14A to FIG. 14C, if the MMC 702 is about to read data from a CPPU M_1 (which is also referred to as a first CPPU) of a PPUG 1303 (which is also referred to as a third PPUG), the MMC 702 first reads the data (referred to as third data) from the CPPU M_1 using the read voltages VB and VC of the predetermined RVG. For instance, the MMC 702 identifies a value of each bit in this physical page using the read voltages VB and VC of the predetermined RVG.

After the data reading operation is completed, the ECCC 708 performs an ECCP according to an ECC (i.e., redundancy bits) corresponding to the read third data. During the ECCP, the MMC 702 determines whether an EBC of the third data is greater than a predetermined EBC threshold. In the present exemplary embodiment, it is assumed that the count of the errors occurring in the second data is greater than the predetermined EBC threshold, the MMC 702 determines that the data in the CPPU M_1 fails to be correctly obtained, and the MMC 702 retries to read the data from the CPPU M_1 by utilizing the retry-read mechanism.

In the retry-read mechanism, the MMC 702 selects a RVG sequentially from the RVGs RR1 to RR3 and retries to read the data from the CPPU M_1 according to voltages of the selected RVG. For instance, the MMC 702 firsts selects the RVG RR1 and reads the third data in the CPPU M_1 according to the read voltages VB_1 and VC_1 of the RVG RR1.

After the data reading operation is completed, the ECCC 708 calculates an EBC occurring in the third data (which is also referred to as a third EBC) according to the ECC (i.e., the redundancy bits) corresponding to the read third data and records the third EBC as an EBC threshold (which is also referred to as a third EBC threshold).

Afterwards, the MMC 702 again selects the RVG RR2 and reads the third data in the CPPU M_1 according to the read voltages VB_2 and VC_2 of the RVG RR2. After the data reading operation is completed, the ECCC 708 calculates the third EBC of the third data according to the ECC (i.e., the redundancy bits) corresponding to the read third data and determines whether the third EBC generated when the reading operation is performed using the read voltages VB_2 and VC_2 is greater than the aforementioned third EBC threshold. It is assumed in this case that the third EBC generated when the reading operation is performed using the read voltages VB_2 and VC_2 is not greater than (e.g., less than) the third EBC threshold, the MMC 702 changes the third EBC threshold as the third EBC generated when the reading operation is performed using the read voltages VB_2 and VC_2.

Afterwards, the MMC 702 further selects the RVG RR3 and reads the third data in the CPPU M_1 according to the read voltages VB_3 and VC_3 of the RVG RR3. After the data reading operation is completed, the ECCC 708 calculates the third EBC of the third data to the ECC (i.e., the redundancy bits) corresponding to the read third data and determines whether the third EBC generated when the reading operation is performed using the read voltages VB_3 and VC_3 is greater than the aforementioned third EBC threshold. It is assumed in this case that the third EBC generated when the reading operation is performed using the read voltages VB_3 and VC_3 is greater than the aforementioned third EBC threshold, and thus, the MMC 702 does not change the third EBC threshold.

After reading the CPPU M_1 respectively using the RVG RR1, the RVG RR2 and the RVG RR3, the MMC 702 may, according to the third EBC threshold, determine that the first EBC generated when the reading operation is performed using the read voltages VB_2 and VC_2 of the RVG RR2 (which is also referred to as a third RVG) for reading the CPPU M_1 is not greater than the third EBC threshold, and thus, the MMC 702 may record the read voltages VB_2 and VC_2 (which are collectively referred to as a sixth voltage) in the lookup table T1. In other words, among the RVGs RR1 to RR3, an optimal voltage for reading the CPPU is the read voltages VB_2 and VC_2, and the third EBC obtained when the CPPU is read using the read voltages VB_2 and VC_2 is the smallest.

It should be mentioned in this case that in the operation of reading the data in the CPPU M_1 when the retry-read mechanism is performed, the MMC 702, if sill failing to correctly obtain the data in the CPPU M_1 after retrying to read using the RVG RR1, the RVG RR2 and the RVG RR3, continues to perform the decoding operation using the encoded data generated by the multi-frame encoding, thereby attempting to obtain the data in the CPPU M_1. In addition, the MMC 702, if succeeding in correctly obtaining the data in the CPPU M_1 by retrying to read the CPPU M_1 using one of the RVG RR1, the RVG RR2 and the RVG RR3, may obtain the correct data and reply to a reading request.

In addition, if the MMC 702 is about to read data from an UPPU U_2 (which is also referred to as a first UPPU) of a PPUG 1305 (which is also referred to as a first PPUG), the MMC 702 first reads the data (referred to as first data) from the UPPU U_2 using the read voltages VD, VE, VF and VG of the predetermined RVG. For instance, the MMC 702 identifies a value of each bit in this physical page using the read voltages VD, VE, VF and VG of the predetermined RVG.

After the data reading operation is completed, the ECCC 708 performs an ECCP according to an ECC (i.e., redundancy bits) corresponding to the read first data. During the ECCP, the MMC 702 determines whether an EBC of the first data is greater than a predetermined EBC threshold. In the present exemplary embodiment, it is assumed that the count of the errors occurring in the first data is greater than the predetermined EBC threshold, the MMC 702 determines that the data in the UPPU U_2 fails to be correctly obtained, and the MMC 702 retries to read the data from the UPPU U_2 by utilizing the retry-read mechanism.

In the retry-read mechanism, the MMC 702 selects a RVG sequentially from the RVGs RR1 to RR3 and retries to read the data from the UPPU U_2 according to voltages of the selected RVG. For instance, the MMC 702 firsts selects the RVG RR1 and reads the first data in the UPPU U_2 according to the read voltages VD_1, VE_1, VF_1 and VG_1 of the RVG RR1.

After the data reading operation is completed, the ECCC 708 calculates an EBC occurring in the first data (which is also referred to as the first EBC) according to the ECC (i.e., the redundancy bits) corresponding to the read first data and records the EBC as an EBC threshold (which is also referred to as the first EBC threshold).

Afterwards, the MMC 702 again selects the RVG RR2 and reads the first data in the UPPU U_2 according to the read voltages VD_2, VE_2, VF_2 and VG_2 of the RVG RR2. After the data reading operation is completed, the ECCC 708 calculates the first EBC of the first data according to the ECC (i.e., the redundancy bits) corresponding to the read first data and determines whether the first EBC generated when the reading operation is performed using the read voltages VD_2, VE_2, VF_2 and VG_2 is greater than the aforementioned first EBC threshold. It is assumed in this case that the first EBC generated when the reading operation is performed using the read voltages VD_2, VE_2, VF_2 and VG_2 is greater than the aforementioned first EBC threshold, the MMC 702 does not change the first EBC threshold.

Afterwards, the MMC 702 further selects the RVG RR3 and reads the first data in the UPPU U_2 according to the read voltages VD_3, VE_3, VF_3 and VG_3 of the of the RVG RR3. After the data reading operation is completed, the ECCC 708 calculates the first EBC of the first data according to the ECC (i.e., the redundancy bits) corresponding to the read first data and determines whether the first EBC generated when the reading operation is performed using the read voltages VD_3, VE_3, VF_3 and VG_3 is greater than the aforementioned first EBC threshold. It is assumed in this case that the first EBC generated when the reading operation is performed using the read voltages VD_3, VE_3, VF_3 and VG_3 is not greater than (e.g., less than) the aforementioned first EBC threshold, the MMC 702 changes the first EBC threshold as the first EBC generated when the reading operation is performed using the read voltages VD_3, VE_3, VF_3 and VG_3.

After reading the UPPU U_2 respectively using the RVG RR1, the RVG RR3 and the RVG RR3, the MMC 702 may, according to the first EBC threshold, determine that the first EBC generated when the reading operation is performed using the read voltages VD_3, VE_3, VF_3 and VG_3 of the RVG RR3 (which is also referred to as a first RVG) for reading the UPPU U_2 is not less than the first EBC threshold, and thus, the MMC 702 may record the read voltages VD_3, VE_3, VF_3 and VG_3 (which are collectively referred to as a second voltage) in the lookup table T1. In other words, among the RVGs RR1 to RR3, an optimal voltage for reading the UPPU is the read voltages VD_3, VE_3, VF_3 and VG_3, and the first EBC when the UPPU is read using the read voltages VD_3, VE_3, VF_3 and VG_3 is the smallest.

It should be mentioned here that in the operation of reading the data in the UPPU U_2 when the retry-read mechanism is performed, the MMC 702, if sill failing to correctly obtain the data in the UPPU U_2 after retrying to read using the RVG RR1, the RVG RR2 and the RVG RR3, continues to perform the decoding operation using the encoded data generated by the multi-frame encoding, thereby attempting to obtain the data in the UPPU U_2. In addition, the MMC 702, if succeeding in correctly obtaining the data in the UPPU U_2 by retrying to read the UPPU U_2 using the RVG RR1, the RVG RR2 and the RVG RR3, may obtain the correct data and reply to a reading request.

Namely, in the retry-read mechanism of the invention, the MMC 702 records the optimal read voltage for reading the LPPU, the optimal read voltage for reading the CPPU, the optimal read voltage for reading the UPPU and generates the lookup table T1 according to these voltage levels.

Specially, in the present exemplary embodiment, the method of multi-frame encoding performs mix-encoding according to the UPPU, the CPPU and the LPPU to generate the encoded data. In contrast, during the process of performing the decoding operation using the encoded data generated by the multi-frame encoding in the related art, one of the predetermined RVG, the RVG RR1, the RVG RR2 and the RVG RR3 is usually selected, and the decoding operation is performed by reading the corresponding PPU according to the selected RVG. However, the optimal voltage suitable for reading the LPPU, the optimal voltage suitable for reading the CPPU and the optimal voltage suitable for reading the CPPU are not within in the same RVG, and thus, when the data required for encoding is read using one of the RVG, the RVG RR1, the RVG RR2 and the RVG RR3, it may result in an EBC (or an error rate) of a read PPU (e.g., the LPPU) being relatively low, while EBCs (or error rates) of other read PPUs (e.g., the CPPU and the UPPU) are relatively high, such that a success rate in decoding the encoded data generated by the multi-frame encoding may be reduced.

Accordingly, the invention records the optimal read voltage for reading the LPPU, the optimal read voltage for reading the CPPU and the optimal read voltage for reading the UPPU of the RVGs RR1 to RR2 in the same lookup table T1, and during the process of performing the decoding operation using the encoded data generated by the multi-frame encoding, the MMC 702 reads the corresponding data using the voltages recorded in the lookup table T1 to achieve the lowest EBCs (or the error rates) of the read UPPU, CPPU and LPPU and to perform the decoding operation according to the read data and the encoded data to correct the errors of the data.

For instance, referring to again FIG. 13 and FIG. 15, it is assumed that one encoded data is generated by encoding the data of LPPUs L_4 and L_5, CPPUs M_2 and M_3 and UPPUs U_0 and U_1. If failure occurs when the UPPU U_0 is read by utilizing the retry-read mechanism, the decoding operation will be performed using the encoded data generated by utilizing the multi-frame encoding. In this circumstance, the MMC 702 reads data (collectively referred to as the sixth data) from the LPPUs L_4 and L_5 according to the read voltage VA_1 recorded in the lookup table T1. Specially, the LPPUs L_4 and L_5 may also be collectively referred to as a "second LPPU", while the PPUGs 1309 and 1311 which the LPPUs L_4 and L_5 belong to may be collectively referred to as a "sixth PPUG".

Similarly, the MMC 702 reads data (collectively referred to as fifth data) from the CPPUs M_2 and M_3 according to the read voltages VB_2 and VC_2 recorded in the lookup table T1. Specially, the CPPUs M_2 and M_3 may be collectively referred to as a "second CPPU", and the PPUGs 1305 and 1307 which the CPPUs M_2 and M_3 belong to may be collectively referred to as a "fifth PPUG".

Similarly, the MMC 702 reads data (collectively referred to as fourth data) from the UPPU U_1 according to the read voltages VD_3, VE_3, VF_3 and VG_3 recorded in the lookup table T1. Specially, the UPPU U_1 may be collectively referred to as "a second UPPU", and the PPUG 1303 which the UPPU U_1 belongs to may be collectively referred to as a "fourth PPUG".

In addition, the MMC 702 may also read the encoded data (which is also referred to as the first encoded data) corresponding to the PPUs L_4 and L_5, the CPPUs M_2 and M_3, the UPPUs U_0 and U_1 and perform the decoding operation according to the encoded data and the fourth data, the fifth data and the sixth data which are read using the lookup table T1 to correct errors in the data (which is also referred to as seventh data) in the UPPU U_0.

It should be noted that in the exemplary embodiment described above, the lookup table T1 is used in the 8-level cell NAND memory module, but the invention is not limited thereto. In an exemplary embodiment, the lookup table may also be generated according to a plurality of RVGs for a 4-level cell NAND memory module. The lookup table includes an optimal voltage for reading a UPPU and an optimal voltage for reading a LPPU, the voltages recorded in the lookup table may be used to read data of the corresponding UPPU and LPPU in the 4-level cell NAND memory module, and a decoding operation may be performed according to the read data and the encoded data.

Figure 16:
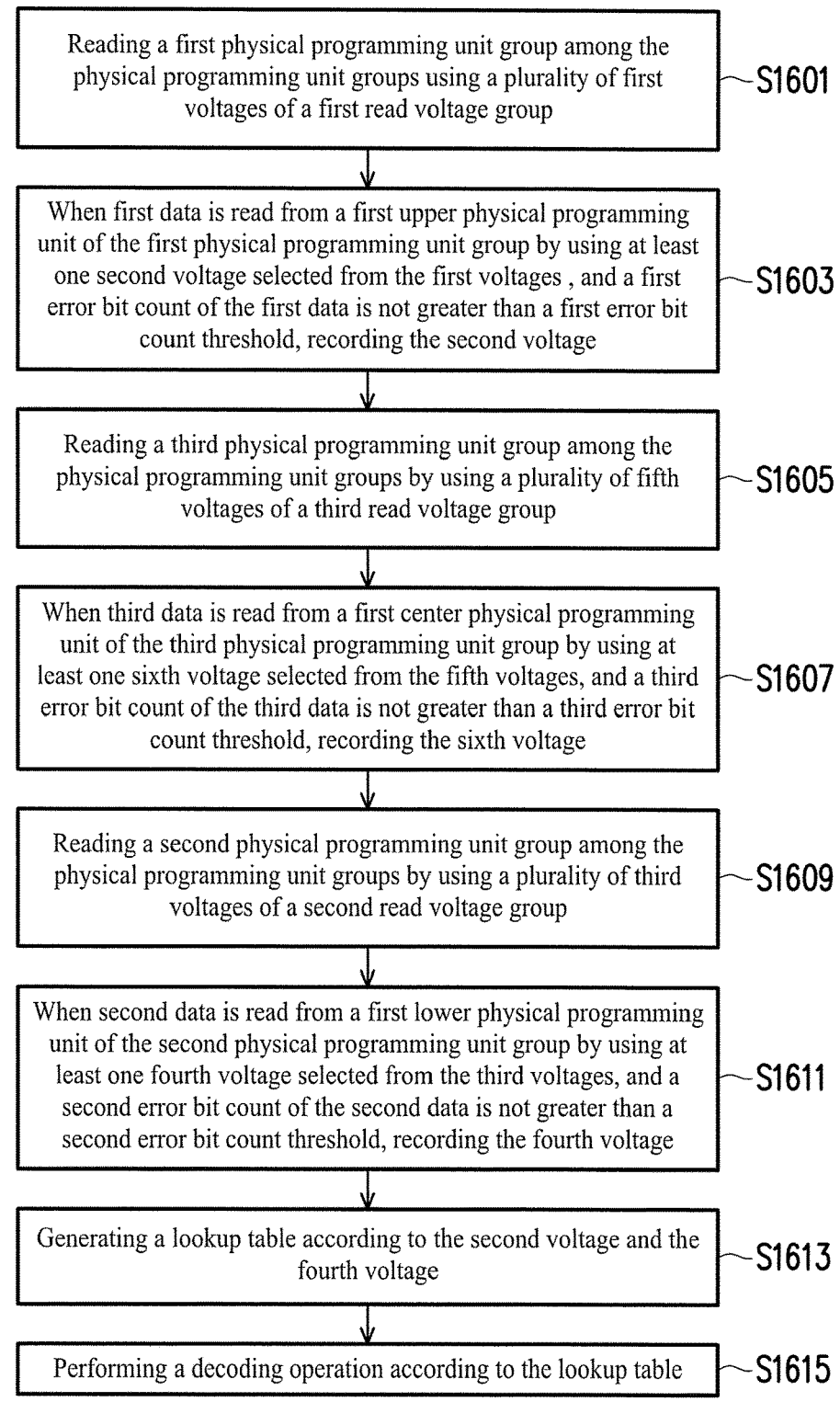
FIG. 16 is a flowchart illustrating a method of generating a lookup table according to an exemplary embodiment of the invention.

FIG. 16 is a flowchart illustrating a method of generating a lookup table according to an exemplary embodiment of the invention.

Referring to FIG. 16, in step S1601, the MMC 702 reads a first PPUG among a plurality of PPUGs by using a plurality of first voltages of a first RVG. When first data is read from a first UPPU of the first PPUG by using a second voltage selected from the first voltages, and a first EBC of the read first data is not greater than a first EBC threshold, in step S1603, the MMC 702 records the second voltage.

In step S1605, the MMC 702 reads a third PPUG among the PPUGs by using a plurality of fifth voltages of a third RVG. When third data is read from a first CPPU of the third PPUG by using a sixth voltage selected from the fifth voltages, and a third EBC of the third data is not greater than a third EBC threshold, in step S1607, the MMC 702 records the sixth voltage.

In step S1609, the MMC 702 reads a second PPUG among the PPUGs using a plurality of third voltages of a second RVG. When second data is read from a first LPPU of the second PPUG by using a fourth voltage selected from the third voltages, and a second EBC of the read second data is not greater than second EBC threshold, in step S1611, the MMC 702 records the fourth voltage.

Afterwards, in step S1613, the MMC 702 generates a lookup table according to the second voltage, the fourth voltage and the sixth voltage. And, in step S1615, the MMC 702 performs a decoding operation according to the lookup table.

Figure 17:
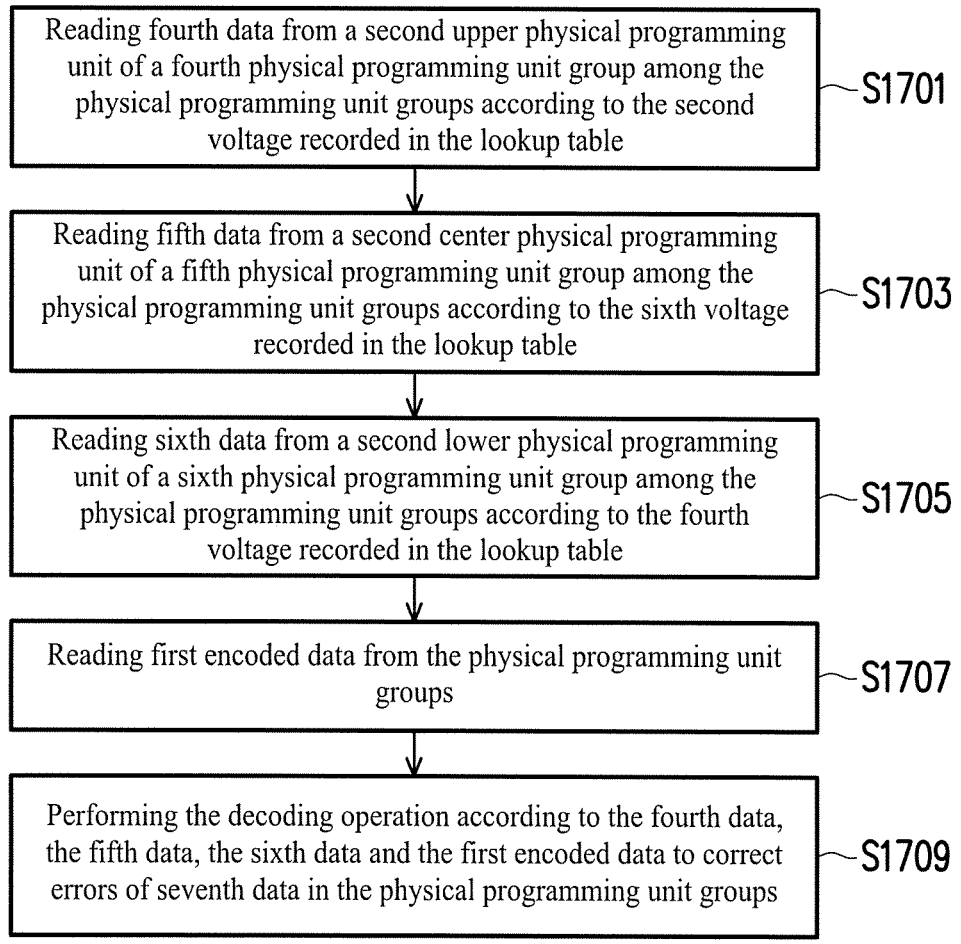
FIG. 17 is a flowchart illustrating a decoding method according to an exemplary embodiment of the invention.

FIG. 17 is a flowchart illustrating a decoding method according to an exemplary embodiment of the invention.

In step S1701, the MMC 702 reads fourth data from a second UPPU of a fourth PPUG among a plurality of PPUGs according to the second voltage recorded in the lookup table. In step S1703, the MMC 702 reads fifth data from a second CPPU of a fifth PPUG among the PPUGs according to the sixth voltage recorded in the lookup table. In step S1705, the MMC 702 reads sixth data from a second LPPU of a sixth PPUG among the PPUGs according to the fourth voltage recorded in the lookup table. In step S1707, the MMC 702 reads first encoded data from the PPUGs. Lastly, in step S1709, the MMC 702 performs the decoding operation according to the fourth data, the fifth data, the sixth data and the first encoded data to correct errors of seventh data in the PPUGs.

In light of the foregoing, the decoding method, the memory controlling circuit unit and the memory storage device of the invention can record a plurality of optimal read voltages for reading data from PPUs of a plurality of RVGs in the same lookup table, and during the process of the decoding operation using the encoded data generated by using the multi-frame encoding, the MMC can use the voltages recorded in the lookup table to read the corresponding data, such that the EBC (or the error rate) of the read data can be the lowest, thereby, enhancing the success rate of correcting the data by the decoding operation subsequently performed according to the read data and the encoded data can be enhanced. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, wherein the rewritable non-volatile memory module has a plurality of physical erasing units, each of the physical erasing units has a plurality of physical programming unit groups, and each of the physical programming unit groups has an upper physical programming unit and a lower physical programming unit, the decoding method comprising:

reading a first physical programming unit group among the physical programming unit groups by using a plurality of first voltages of a first read voltage group;

obtaining at least one second voltage if first data is read from a first upper physical programming unit of the first physical programming unit group by using the second voltage selected from the first voltages, and a first error bit count of the first data is not greater than a first error bit count threshold;

reading a second physical programming unit group among the physical programming unit groups by using a plurality of third voltages of a second read voltage group;

obtaining at least one fourth voltage if second data is read from a first lower physical programming unit of the second physical programming unit group by using the fourth voltage selected from the third voltages, and a second error bit count of the second data is not greater than a second error bit count threshold;

recording the second voltage and the fourth voltage in a lookup table; and performing a decoding operation by using the second voltage and the fourth voltage recorded in the lookup table.

2. The decoding method according to claim 1, wherein each of the physical programming unit groups further has a center physical programming unit, and the decoding method further comprises:

reading a third physical programming unit group among the physical programming unit groups by using a plurality of fifth voltages of a third read voltage group; and obtaining at least one sixth voltage if third data is read from a first center physical programming unit of the third physical programming unit group by using the sixth voltage selected from the fifth voltages, and a third error bit count of the third data is not greater than a third error bit count threshold, wherein the step of recording the second voltage and the fourth voltage in the lookup table comprises:

recording the second voltage, the fourth voltage and the sixth voltage in the lookup table.

3. The decoding method according to claim 2, wherein the step of performing the decoding operation by using the second voltage and the fourth voltage recorded in the lookup table comprises:

reading fourth data from a second upper physical programming unit of a fourth physical programming unit group among the physical programming unit groups according to the second voltage recorded in the lookup table;

reading fifth data from a second center physical programming unit of a fifth physical programming unit group among the physical programming unit groups according to the sixth voltage recorded in the lookup table; and reading sixth data from a second lower physical programming unit of a sixth physical programming unit group among the physical programming unit groups according to the fourth voltage recorded in the lookup table.

4. The decoding method according to claim 3, wherein the step of performing the decoding operation by using the second voltage and the fourth voltage recorded in the lookup table further comprises:

reading first encoded data from the physical programming unit groups; and performing the decoding operation according to the fourth data, the fifth data, the sixth data and the first encoded data to correct errors of seventh data in the physical programming unit groups.

5. The decoding method according to claim 2, further comprises:

presetting a plurality of read voltage groups, each of the read voltage groups comprising a plurality of voltages, and the read voltage groups comprising the first read voltage group, the second read voltage group and the third read voltage group.

6. A memory controlling circuit unit for a rewritable non-volatile memory module, wherein the rewritable non-volatile memory module has a plurality of physical erasing units, each of the physical erasing units has a plurality of physical programming unit groups, and each of the physical programming unit groups has an upper physical programming unit and a lower physical programming unit, the memory controlling circuit unit comprising:

a host interface, configured to be coupled to a host system;

a memory interface, configured to be coupled to the rewritable non-volatile memory module;

a memory management circuit, coupled to the host interface and the memory interface, wherein the memory management circuit is configured to read a first physical programming unit group among the physical programming unit groups by using a plurality of first voltages of a first read voltage group, wherein the memory management circuit is further configured to obtain at least one second voltage if first data is read from a first upper physical programming unit of the first physical programming unit group by using the second voltage selected from the first voltages, and a first error bit count of the first data is not greater than a first error bit count threshold, wherein the memory management circuit is further configured to read a second physical programming unit group among the physical programming unit groups by using a plurality of third voltages of a second read voltage group, wherein the memory management circuit is further configured to obtain at least one fourth voltage if second data is read from a first lower physical programming unit of the second physical programming unit group by using the fourth voltage selected from the third voltages, and a second error bit count of the second data is not greater than a second error bit count threshold, wherein the memory management circuit is further configured to record the second voltage and the fourth voltage in a lookup table, wherein the memory management circuit is further configured to perform a decoding operation by using the second voltage and the fourth voltage recorded in the lookup table.

7. The memory controlling circuit unit according to claim 6, wherein each of the physical programming unit groups further has a center physical programming unit, wherein the memory management circuit reads a third physical programming unit group among the physical programming unit groups by using a plurality of fifth voltages of a third read voltage group, wherein the memory management circuit obtains at least one sixth voltage if third data is read from a first center physical programming unit of the third physical programming unit group by using the sixth voltage selected from the fifth voltages, and a third error bit count of the third data is not greater than a third error bit count threshold, wherein in the operation of recording the second voltage and the fourth voltage in the lookup table, the memory management circuit records the second voltage, the fourth voltage and the sixth voltage in the lookup table.

8. The memory controlling circuit unit according to claim 7, wherein in the operation of performing the decoding operation by using the second voltage and the fourth voltage recorded in the lookup table, the memory management circuit reads fourth data from a second upper physical programming unit of a fourth physical programming unit group among the physical programming unit groups according to the second voltage recorded in the lookup table, the memory management circuit reads fifth data from a second center physical programming unit of a fifth physical programming unit group among the physical programming unit groups according to the sixth voltage recorded in the lookup table, and the memory management circuit reads sixth data from a second lower physical programming unit of a sixth physical programming unit group among the physical programming unit groups according to the fourth voltage recorded in the lookup table.

9. The memory controlling circuit unit according to claim 8, wherein in the operation of performing the decoding operation by using the second voltage and the fourth voltage recorded in the lookup table, the memory management circuit reads first encoded data from the physical programming unit groups, and the memory management circuit performs the decoding operation according to the fourth data, the fifth data, the sixth data and the first encoded data to correct errors of seventh data in the physical programming unit groups.

10. The memory controlling circuit unit according to claim 7, wherein the memory management circuit presets a plurality of read voltage groups, each of the read voltage groups comprises a plurality of voltages, and the read voltage groups comprise the first read voltage group, the second read voltage group and the third read voltage group.

11. A memory storage device, comprising:

a connection interface unit, configured to be coupled to a host system;

a rewritable non-volatile memory module, having a plurality of physical erasing units, each of the physical erasing units having a plurality of physical programming unit groups, and each of the physical programming unit groups having an upper physical programming unit and a lower physical programming unit; and a memory controlling circuit unit, coupled to the connection interface unit and the rewritable non-volatile memory module, wherein the memory controlling circuit unit is configured to read a first physical programming unit group among the physical programming unit groups by using a plurality of first voltages of a first read voltage group, wherein the memory controlling circuit unit is further configured to obtain at least one second voltage if first data is read from a first upper physical programming unit of the first physical programming unit group by using the second voltage selected from the first voltages, and a first error bit count of the first data is not greater than a first error bit count threshold, wherein the memory controlling circuit unit is further configured to read a second physical programming unit group among the physical programming unit groups by using a plurality of third voltages of a second read voltage group, wherein the memory controlling circuit unit is further configured to obtaining at least one fourth voltage if second data is read from a first lower physical programming unit of the second physical programming unit group by using the fourth voltage selected from the third voltages, and a second error bit count of the second data is not greater than a second error bit count threshold, wherein the memory controlling circuit unit is further configured to record the second voltage and the fourth voltage in a lookup table, wherein the memory controlling circuit unit is further configured to perform a decoding operation by using the second voltage and the fourth voltage recorded in the lookup table.

12. The memory storage device according to claim 11, wherein each of the physical programming unit groups further has a center physical programming unit, wherein the memory controlling circuit unit reads a third physical programming unit group among the physical programming unit groups by using a plurality of fifth voltages of a third read voltage group, the memory controlling circuit unit obtains at least one sixth voltage if third data is read from a first center physical programming unit of the third physical programming unit group by using the sixth voltage selected from the fifth voltages, and a third error bit count of the third data is not greater than a third error bit count threshold, wherein in the operation of recording the second voltage and the fourth voltage in the lookup table, the memory controlling circuit unit records the second voltage, the fourth voltage and the sixth voltage in the lookup table.

13. The memory storage device according to claim 12, wherein in the operation of performing the decoding operation by using the second voltage and the fourth voltage recorded in the lookup table, the memory controlling circuit unit reads fourth data from a second upper physical programming unit of a fourth physical programming unit group among the physical programming unit groups according to the second voltage recorded in the lookup table, the memory controlling circuit unit reads fifth data from a second center physical programming unit of a fifth physical programming unit group among the physical programming unit groups according to the sixth voltage recorded in the lookup table, and the memory controlling circuit unit reads sixth data from a second lower physical programming unit of a sixth physical programming unit group among the physical programming unit groups according to the fourth voltage recorded in the lookup table.

14. The memory storage device according to claim 13, wherein in the operation of performing the decoding operation by using the second voltage and the fourth voltage recorded in the lookup table, the memory controlling circuit unit reads first encoded data from the physical programming unit groups, and the memory controlling circuit unit performs the decoding operation according to the fourth data, the fifth data, the sixth data and the first encoded data to correct errors of seventh data in the physical programming unit groups.

15. The memory storage device according to claim 12, wherein the memory controlling circuit unit presets a plurality of read voltage groups, each of the read voltage groups comprises a plurality of voltages, and the read voltage groups comprise the first read voltage group, the second read voltage group and the third read voltage group.

\* \* \* \* \*